United States Patent
Nakashima et al.

(10) Patent No.: US 10,312,904 B2
(45) Date of Patent: Jun. 4, 2019

(54) POWER CONVERTER

(71) Applicant: MITSUBISHI ELECTRIC CORPORATION, Chiyoda-ku, Tokyo (JP)

(72) Inventors: Yukio Nakashima, Tokyo (JP); Takayoshi Miki, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/751,982

(22) PCT Filed: Sep. 3, 2015

(86) PCT No.: PCT/JP2015/075071
§ 371 (c)(1),
(2) Date: Feb. 12, 2018

(87) PCT Pub. No.: WO2017/037917
PCT Pub. Date: Mar. 9, 2017

(65) Prior Publication Data
US 2018/0241389 A1    Aug. 23, 2018

(51) Int. Cl.
*H03K 17/567* (2006.01)
*H02M 1/00* (2006.01)
(Continued)

(52) U.S. Cl.
CPC ............ *H03K 17/567* (2013.01); *H02M 1/00* (2013.01); *H02M 1/08* (2013.01); *H02M 3/00* (2013.01);
(Continued)

(58) Field of Classification Search
CPC .................................................... H03K 17/567
See application file for complete search history.

(56) References Cited

U.S. PATENT DOCUMENTS

| 5,926,012 A | 7/1999 | Takizawa et al. |
| 6,809,561 B2 * | 10/2004 | Katoh ............ H02M 1/32 327/108 |

(Continued)

FOREIGN PATENT DOCUMENTS

| JP | 10-150764 A | 6/1998 |
| JP | 2002-158320 A | 5/2002 |

(Continued)

OTHER PUBLICATIONS

International Search Report (PCT/ISA/210) dated Nov. 24, 2015, by the Japanese Patent Office as the International Searching Authority for International Application No. PCT/JP2015/075071.
(Continued)

*Primary Examiner* — Hai L Nguyen
(74) *Attorney, Agent, or Firm* — Buchanan Ingersoll & Rooney PC

(57) ABSTRACT

A power semiconductor module having switching elements includes: a collector main terminal and a collector auxiliary terminal connected to a collector potential of the switching element; a gate auxiliary terminal connected to a gate potential of the switching element; and an emitter main terminal and an emitter auxiliary terminal connected to an emitter potential of the switching element. A power converter includes a voltage dividing circuit board that generates a divided voltage obtained by dividing a voltage between the collector auxiliary terminal and the emitter auxiliary terminal and transmits to a gate driving circuit. The voltage dividing circuit board is electrically connected to the collector auxiliary terminal and the emitter auxiliary terminal. A gate driving circuit changes a driving speed of the switching element according to the divided voltage.

6 Claims, 13 Drawing Sheets

(51) Int. Cl.
  *H02M 3/00* (2006.01)
  *H02M 7/48* (2007.01)
  *H02M 1/08* (2006.01)
  *H02M 7/00* (2006.01)
  *H02M 7/538* (2007.01)
  *H03K 19/0175* (2006.01)
  *H03K 17/16* (2006.01)
  *H03K 17/795* (2006.01)

(52) U.S. Cl.
  CPC ............ *H02M 7/003* (2013.01); *H02M 7/48* (2013.01); *H02M 7/538* (2013.01); *H03K 17/166* (2013.01); *H03K 17/7955* (2013.01); *H03K 19/017509* (2013.01); *H03K 2217/0081* (2013.01)

(56) References Cited

U.S. PATENT DOCUMENTS

| | | | | |
|---|---|---|---|---|
| 7,038,500 | B2* | 5/2006 | do Nascimento | H03K 17/0406 327/108 |
| 7,570,102 | B2 | 8/2009 | Tai | |
| 8,836,311 | B2* | 9/2014 | Tai | H02M 1/08 323/289 |
| 9,203,393 | B2 | 12/2015 | Takasu et al. | |
| 9,628,072 | B2 | 4/2017 | Toshiyuki et al. | |
| 10,038,438 | B2* | 7/2018 | Nakano | H03K 17/08122 |
| 10,075,098 | B2* | 9/2018 | Imura | H03K 17/0822 |

FOREIGN PATENT DOCUMENTS

| | | |
|---|---|---|
| JP | 2003-070234 A | 3/2003 |
| JP | 2003-284319 A | 10/2003 |
| JP | 2005-086940 A | 3/2005 |
| JP | 2006-042564 A | 2/2006 |
| JP | 2008-271752 A | 11/2008 |
| JP | 2012-039683 A | 2/2012 |
| JP | 2014-050179 A | 3/2014 |
| JP | 2014-216932 A | 11/2014 |

OTHER PUBLICATIONS

Written Opinion (PCT/ISA/237) dated Nov. 24, 2015, by the Japanese Patent Office as the International Searching Authority for International Application No. PCT/JP2015/075071.

Notification of Reason for Refusal for Japanese Patent Application No. 2017-501417 dated Feb. 9, 2017.

Notification of Reason for Refusal for Japanese Patent Application No. 2017-501417 dated Jun. 20, 2017.

\* cited by examiner

POWER CONVERTER

FIELD

The present invention relates to a power converter including a power semiconductor module having a power semiconductor switching element provided therein.

BACKGROUND

A power converter such as an inverter device, a servo amplifier device, and a switching power supply device contains a power semiconductor switching element. In the power semiconductor switching element, a conductive state between a first main terminal and a second main terminal changes according to an electric signal that is applied between a first signal input terminal and a second signal input terminal. A gate driving circuit applies the electric signal between the first signal input terminal and the second signal input terminal of the power semiconductor switching element to drive the power semiconductor switching element.

As a related art, a power converter is known which generates a divided voltage by dividing a voltage between the main terminals of the power semiconductor switching element by an electric component, transmits the divided voltage to the gate driving circuit, and changes a driving method of the power semiconductor switching element according to the divided voltage transmitted to the gate driving circuit (for example, refer to Patent Literatures 1 and 2).

In Patent Literature 1, the divided voltage obtained by dividing the voltage between the main terminals of the power semiconductor switching element by a resistor is generated and transmitted to the gate driving circuit. A structure of the gate driving circuit is disclosed which includes a current driving unit for injecting a current into the first signal input terminal of the power semiconductor switching element according to the divided voltage.

In addition, in Patent Literature 2, a divided voltage obtained by dividing a voltage between the main terminals of the power semiconductor switching element by two capacitors is generated and transmitted to the gate driving circuit. The two capacitors for generating the divided voltage are molded in a single package to form an element module. When the divided voltage becomes higher than a reference value, a built-in FET part is turned off and operates so that the gate driving circuit has a high impedance.

CITATION LIST

Patent Literature

Patent Literature 1: Japanese Patent Application Laid-Open No. 2005-86940
Patent Literature 2: Japanese Patent Application Laid-Open No. 2014-50179

SUMMARY

Technical Problem

A power converter needs mechanical strength to withstand vibrations and especially the large vibrations that are applied to a power converter mounted on a mobile body such as an automobile or a railway vehicle. Even a power converter installed in a building should withstand the vibrations at the time of transportation.

Here, Patent Literature 1 does not disclose a technology regarding the mechanical strength to withstand the vibrations. Furthermore, in the power converter of Patent Literature 2, because the two capacitors for generating the divided voltage are molded in the single package, it is expected to have the mechanical strength capable of withstanding the vibrations. However, because the capacitors are molded, there is a problem in that it is difficult to change a constant of impedance elements for generating the divided voltages.

The present invention has been made in view of the above. A purpose of the present invention is to obtain a power converter that can easily change a constant of impedance elements for generating divided voltages while ensuring mechanical strength to withstand vibrations.

Solution to Problem

In order to solve the problem and achieve the objective mentioned above, the present invention relates to a power converter that includes: a power semiconductor module to house therein one or a plurality of power semiconductor switching elements; and a gate driving circuit to drive the power semiconductor switching element. The power semiconductor module includes: a first main terminal and a first signal input terminal connected to a collector potential or a drain potential of the power semiconductor switching element; a second signal input terminal connected to a gate potential of the power semiconductor switching element; and a second main terminal and a third signal input terminal connected to an emitter potential or a source potential of the power semiconductor switching element. The power converter includes a voltage dividing circuit board to generate a divided voltage obtained by detecting a voltage between the first signal input terminal and the third signal input terminal and to transmit the voltage to the gate driving circuit; the voltage dividing circuit board is mounted on the power semiconductor module so as to be electrically connected to the first signal input terminal and the third signal input terminal; and the gate driving circuit changes a driving speed of the power semiconductor switching element in accordance with the divided voltage that is output from the voltage dividing circuit board.

Advantageous Effects of Invention

According to the present invention, an advantageous effect can be obtained such that a constant of impedance elements for generating divided voltages can be easily changed while mechanical strength to withstand vibrations is ensured.

DESCRIPTION OF EMBODIMENTS

A power converter according to embodiments of the present invention will be described below with reference to the accompanying drawings. The present invention is not limited to the embodiments described herein.

First Embodiment

Figure 1:
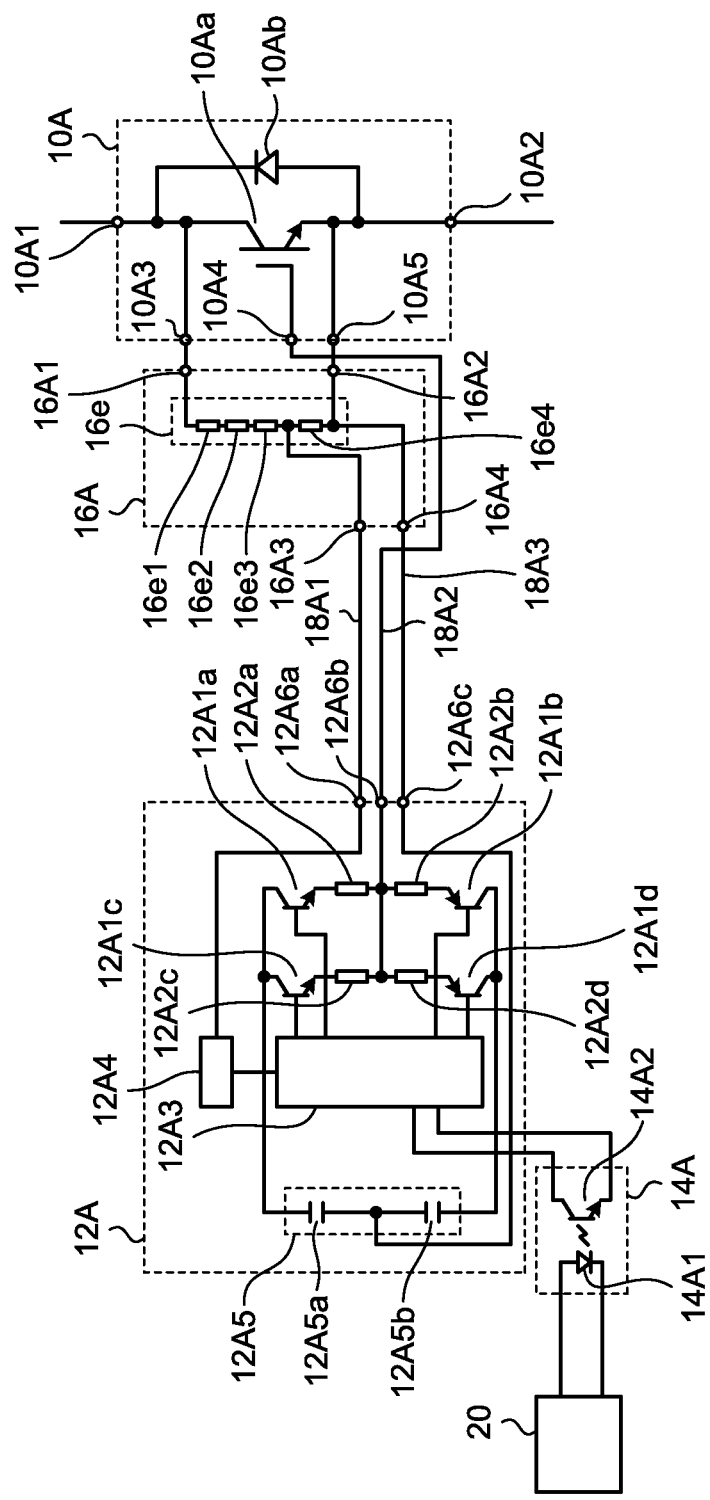
FIG. 1 is a circuit diagram illustrating a configuration of a main part of a power converter according to a first embodiment.
Figure 2:
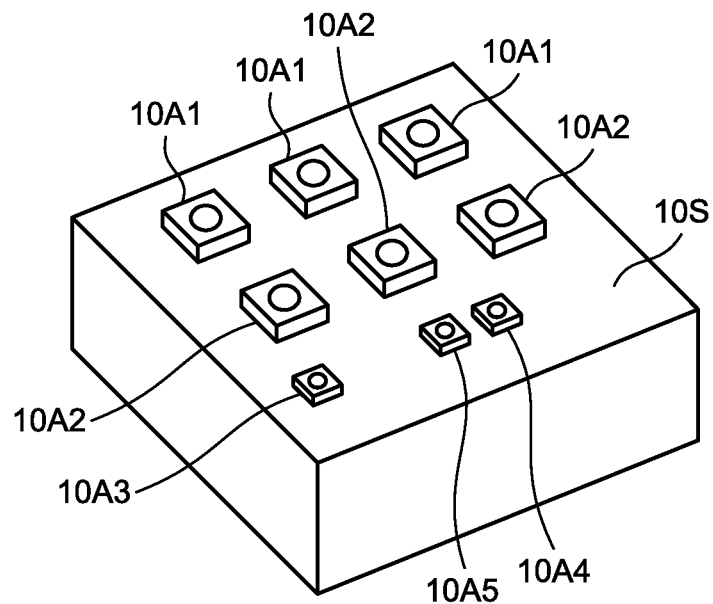
FIG. 2 is a perspective view illustrating an exemplary configuration of a power semiconductor module in the power converter according to the first embodiment.
Figure 3:
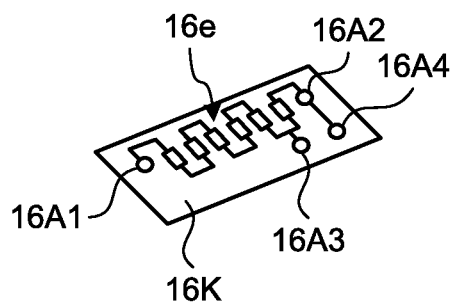
FIG. 3 is a perspective view illustrating an exemplary configuration of a voltage dividing circuit in the power converter according to the first embodiment.
Figure 4:
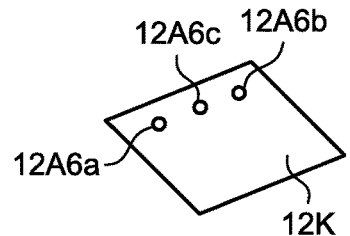
FIG. 4 is a perspective view illustrating an arrangement example of terminals of a gate driving circuit in the power converter according to the first embodiment.
Figure 5:
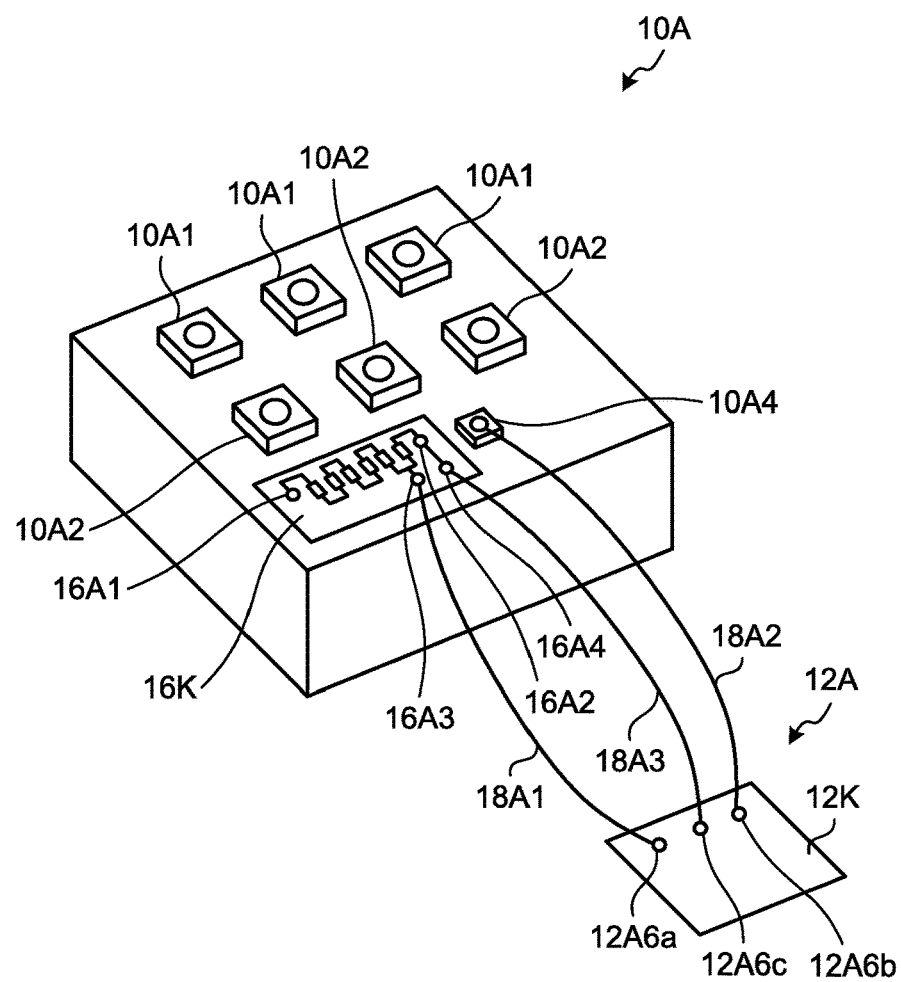
FIG. 5 is a perspective view illustrating a connection example between a gate driving circuit board, a voltage dividing circuit board, and the power semiconductor module in the power converter according to the first embodiment.

First, a configuration of a power converter according to a first embodiment will be described with reference to FIGS. 1 to 5. FIG. 1 is a circuit diagram illustrating a configuration of the main parts of the power converter according to the first embodiment. Each of FIGS. 2 to 5 is a perspective view illustrating the configuration of a main part of the power converter according to the first embodiment. FIG. 2 illustrates an arrangement example of terminals of a power semiconductor module 10A, and FIG. 3 illustrates an exemplary configuration of a voltage dividing circuit 16A. FIG. 4 illustrates an arrangement example of terminals of a gate driving circuit 12A, and FIG. 5 illustrates a connection example between a circuit board 12K, a voltage dividing circuit board 16K, and the power semiconductor module 10A configured as illustrated in FIGS. 2 to 4. The configurations illustrated in FIGS. 2 to 5 are only exemplary, and the present invention is not limited to the configuration examples illustrated in FIGS. 2 to 5.

In FIG. 1, the power converter according to the first embodiment includes the power semiconductor module 10A, which houses therein a power semiconductor switching element to drive a drive load (for example, a motor), which is not illustrated; the gate driving circuit 12A, which is a peripheral circuit to control the power semiconductor module 10A; a switching signal generation unit 20, which generates a switching signal to control the power semiconductor module 10A; an insulation circuit 14A, which receives the switching signal generated by the switching signal generation unit 20 and transmits the signal to the gate driving circuit 12A; and the voltage dividing circuit 16A, which detects a voltage between the main terminals of the power semiconductor module 10A and generates a divided voltage.

The power semiconductor module 10A houses the power semiconductor switching element, in which a transistor element 10Aa and a diode element 10Ab are connected in parallel. As the transistor element 10Aa, an IGBT as illustrated in FIG. 1 is exemplified. However, the transistor element 10Aa is not limited to being an IGBT, and, for example, a MOSFET can be used. Depending on the characteristics of the load, the connection of the diode element 10Ab can be omitted, e.g., as in the case of a resistance load.

The power semiconductor module 10A makes up a single arm of a power conversion circuit. If the power conversion circuit is a circuit having a half-bridge configuration (referred to as "half-bridge circuit"), the power conversion circuit is configured by connecting two power semiconductor modules in series. In the half-bridge circuit, a power semiconductor switching element to which a high-potential-side voltage is applied is referred to as a "positive-side power semiconductor switching element", a "P-side power semiconductor switching element", and an "upper-side power semiconductor switching element". Furthermore, the above power semiconductor switching element is referred to as a "positive-side arm", a "high-potential-side arm", a "P-side arm", an "upper-side arm", and the like. A power semiconductor switching element to which a low-potential-side voltage is applied is referred to as a "negative-side power semiconductor switching element", an "N-side power semiconductor switching element", and a "lower-side power semiconductor switching element". Furthermore, the above power semiconductor switching element is also referred to as a "negative-side arm", a "low-potential-side arm", an "N-side arm", a "lower-side arm", and the like. If the power conversion circuit is a single-phase inverter circuit, the circuit can be configured by connecting the two half-bridge circuits in parallel; and if the power conversion circuit is a three-phase inverter circuit, the circuit can be configured by connecting the three half-bridge circuits in parallel.

The power semiconductor module 10A is provided with a collector main terminal 10A1, which is a first main terminal; an emitter main terminal 10A2, which is a second main terminal connected to an emitter potential of the transistor element 10Aa; a collector auxiliary terminal 10A3, which is a first signal input terminal; a gate auxiliary terminal 10A4, which is a second signal input terminal; and an emitter auxiliary terminal 10A5, which is a third signal input terminal. As illustrated in FIG. 1, the collector main terminal 10A1 is connected to a collector potential of the transistor element 10Aa, the emitter main terminal 10A2 and the emitter auxiliary terminal 10A5 are connected to the emitter potential, and the gate auxiliary terminal 10A4 is connected to a gate potential. In a case where the transistor element 10Aa is a MOSFET, the "collector potential" is replaced with a "drain potential", and the "emitter potential" is replaced with a "source potential".

An arrangement example of the collector main terminal 10A1, the emitter main terminal 10A2, the collector auxiliary terminal 10A3, the gate auxiliary terminal 10A4, and the emitter auxiliary terminal 10A5 is as illustrated in FIG. 2.

According to FIG. 2, the three collector main terminals 10A1, the three emitter main terminals 10A2, the single collector auxiliary terminal 10A3, the single gate auxiliary terminal 10A4, and the single emitter auxiliary terminal 10A5 are arranged on one main surface of a module housing 10S. The three collector main terminals 10A1 are arranged along the longitudinal direction on one side of the module housing 10S in the longitudinal direction, and the three emitter main terminals 10A2 are arranged along the longitudinal direction of the module housing 10S at the center of the module housing 10S. The single collector auxiliary terminal 10A3, the single gate auxiliary terminal 10A4, and the single emitter auxiliary terminal 10A5 are arranged along the longitudinal direction of the module housing 10S on the other side of the module housing 10S in the longitudinal direction. The arrangement example in FIG. 2 is only an example, and it is clearly understood that other arrangement examples can be used.

The description here returns to FIG. 1, which shows the gate driving circuit 12A drives the power semiconductor module 10A. Here, the gate driving circuit 12A is provided for each power semiconductor switching element. That is, if the power conversion circuit, which is the main circuit of the power converter, is a single-phase inverter circuit, four gate driving circuits are provided; and if the power conversion circuit is a three-phase inverter circuit, six gate driving circuits are provided.

The gate driving circuit 12A includes four transistor elements, i.e., a first ON transistor 12A1a, a first OFF transistor 12A1b, a second ON transistor 12A1c, and a second OFF transistor 12A1d, that are bridge-connected. The first ON transistor 12A1a and the first OFF transistor 12A1b are connected in series via two gate resistors 12A2a and 12A2b, and the second ON transistor 12A1c and the second OFF transistor 12A1d are connected in series via two gate resistors 12A2c and 12A2d.

The gate driving circuit 12A is provided with a divided voltage input terminal 12A6a, which is one input terminal, and a gate output terminal 12A6b and an emitter output terminal 12A6c, which are two output terminals. A connection point between the gate resistors 12A2a and 12A2b and a connection point between the gate resistors 12A2c and 12A2d are coupled to each other, and the connection points are coupled to the gate output terminal 12A6b.

FIG. 4 illustrates an arrangement example of the terminals of the gate driving circuit 12A, and the circuit configuration illustrated in FIG. 1 is realized by providing the circuit board 12K with the divided voltage input terminal 12A6a, the gate output terminal 12A6b, and the emitter output terminal 12A6c. Note that the circuit board 12K and a circuit board on which the gate driving circuit 12A is mounted can form a single board as well as being different boards. The circuit board is referred to as a "gate driving circuit board" below.

The description returns here to the gate driving circuit 12A in FIG. 1. In the gate driving circuit 12A, capacitors 12A5a and 12A5b are connected in series and function as an operation power supply 12A5 of the first ON transistor 12A1a and the first OFF transistor 12A1b. A connection point between the capacitors 12A5a and 12A5b is coupled to the emitter output terminal 12A6c in the gate driving circuit 12A.

Furthermore, the gate driving circuit 12A includes a switching speed change unit 12A3, which changes the speed at the time of driving of the power semiconductor module 10A. The switching speed change unit 12A3 can be configured from, for example, a logic circuit.

In addition, the gate driving circuit 12A includes a divided voltage determination unit 12A4. A divided voltage, which is generated by the voltage dividing circuit 16A described later, is input to the divided voltage determination unit 12A4. The divided voltage that is input includes information regarding the voltage between the main terminals in the power semiconductor module 10A. The divided voltage determination unit 12A4 compares the divided voltage with a reference voltage; generates a signal indicating that the divided voltage is higher or lower than the reference voltage (referred to as "voltage determination signal" or "determination signal" below); and outputs the signal to the switching speed change unit 12A3.

The insulation circuit 14A electrically insulates the switching signal generation unit 20 from the gate driving circuit 12A. As illustrated in FIG. 1, the insulation circuit 14A can be configured from a photocoupler including a light emitting diode 14A1 and a phototransistor 14A2.

The voltage dividing circuit 16A has an impedance element group 16e in which a plurality of impedance elements are connected in series. In FIG. 1, four resistive elements 16e1, 16e2, 16e3, and 16e4 connected in series are exemplified.

The voltage dividing circuit 16A is provided with a collector connection terminal 16A1 and an emitter connection terminal 16A2, which are two connection terminals; a divided voltage output terminal 16A3, which is a single output terminal; and an emitter input terminal 16A4, which is a single input terminal. One end of the resistive element 16e1 is coupled to the collector connection terminal 16A1, and one end of the resistive element 16e4 is coupled to both of the emitter connection terminal 16A2 and the emitter input terminal 16A4. A connection point between the resistive elements 16e3 and 16e4 is coupled to the divided voltage output terminal 16A3. That is, in the configuration in FIG. 1, the divided voltage generated in the resistive element 16e4 is applied to the divided voltage determination unit 12A4.

FIG. 3 illustrates an exemplary configuration of the voltage dividing circuit 16A. The circuit configuration in FIG. 1 is realized by arranging the impedance element group 16e on the voltage dividing circuit board 16K; coupling the resistive elements with electric lines respectively formed in substantially U-shapes so that the terminals can be easily provided; and providing the collector connection terminal 16A1, the emitter connection terminal 16A2, the divided voltage output terminal 16A3, and the emitter input terminal 16A4 on the electric lines.

As illustrated in FIG. 5, the voltage dividing circuit 16A is mounted on the power semiconductor module 10A. At this time, the collector connection terminal 16A1 and the collector auxiliary terminal 10A3 of the power semiconductor module 10A are electrically connected to each other, and the emitter connection terminal 16A2 and the emitter auxiliary terminal 10A5 of the power semiconductor module 10A are electrically connected to each other. In addition, the divided voltage output terminal 16A3 of the voltage dividing circuit 16A and the divided voltage input terminal 12A6a of the gate driving circuit board 12K are connected to each other by a signal line 18A1, which is a divided voltage signal line, and the gate auxiliary terminal 10A4 of the power semiconductor module 10A and the gate output terminal 12A6b of the gate driving circuit board 12K are connected to each other by a signal line 18A2, which is a gate signal line. The emitter input terminal 16A4 of the voltage dividing circuit 16A and the emitter output terminal 12A6c of the gate driving circuit board 12K are connected to each other by a signal line 18A3, which is an emitter signal line. With these configurations, the circuit configuration illustrated in FIG. 1 is realized.

Note that the impedance element group 16e can be formed by connecting capacitors or diodes in series instead of the resistive elements. The configuration is not limited to series connection of the resistive elements, the capacitors, or the diodes, and parallel circuits of the resistive elements, the capacitors, or the diodes connected in series can be used. In addition, a combination of at least two of the resistive element, the capacitor, and the diode can be used.

Although FIG. 1 illustrates an example in which the divided voltage generated in the resistive element 16e4 is detected, it is possible to use a larger divided voltage depending on the withstandable input voltage of the divided voltage determination unit 12A4. For example, the voltages generated in the resistive elements 16e3 and 16e4, i.e., the voltage across the resistive elements 16e3 and 16e4, can be taken out as a divided voltage.

Next, an operation of the main parts of the power converter according to the first embodiment will be described.

First, the switching signal generation unit 20 generates a switching signal for driving the power semiconductor module 10A and outputs the signal to the insulation circuit 14A.

When, for example, a command signal to perform control for turning on the power semiconductor module 10A (referred to as "ON command signal" below) is input to the insulation circuit 14A as the switching signal from the switching signal generation unit 20, the light emitting diode 14A1 is turned on and the phototransistor 14A2 is brought into a conductive state. When, for example, a command signal to perform control for turning off the power semiconductor module 10A (referred to as "OFF command signal" below) is input to the insulation circuit 14A as the switching signal from the switching signal generation unit 20, the light emitting diode 14A1 is turned off and the phototransistor 14A2 is brought into a non-conductive state. In this way, the switching speed change unit 12A3 of the gate driving circuit 12A recognizes the ON command signal and the OFF command signal from the switching signal generation unit 20 as a current change due to a change in the conductive state of the phototransistor 14A2.

The voltage dividing circuit 16A generates a divided voltage obtained by dividing a voltage applied between the main terminals of the power semiconductor module 10A, i.e., a voltage between the collector main terminal 10A1, which is the first main terminal of the power semiconductor module 10A, and the emitter main terminal 10A2, which is the second main terminal of the power semiconductor module 10A, and then it outputs the generated divided voltage to the gate driving circuit 12A.

The divided voltage generated by the voltage dividing circuit 16A is input to the divided voltage determination unit 12A4 of the gate driving circuit 12A. As described above, the divided voltage determination unit 12A4 generates the determination signal indicating that the divided voltage is higher or lower than the reference voltage and outputs the determination signal to the switching speed change unit 12A3.

The switching speed change unit 12A3 changes the driving speed of the power semiconductor module 10A in accordance with the determination signal from the divided voltage determination unit 12A4 and the command signal from the insulation circuit 14A. Details of an operation when changing the driving speed of the power semiconductor module 10A are as follows.

First, in a case where the speed when the power semiconductor module 10A is turned on is made higher, both the first ON transistor 12A1a and the second ON transistor 12A1c are controlled such that they are turned on, and both the first OFF transistor 12A1b and the second OFF transistor 12A1d are controlled such that are turned off. When both the first ON transistor 12A1a and the second ON transistor 12A1c are controlled such that they are turned on, both the gate resistors 12A2a and 12A2c are connected to the first signal input terminal 10A3 in parallel so that gate resistances are decreased and the switching speed becomes higher.

In a case, however, where the speed when the power semiconductor module 10A is turned on is slowed down, only one of the first ON transistor 12A1a and the second ON transistor 12A1c is controlled such that it is turned on, and both the first OFF transistor 12A1b and the second OFF transistor 12A1d are controlled such that they are turned off. For example, when only the first ON transistor 12A1a is controlled such that it is turned on, only the gate resistor 12A2a is connected to the first signal input terminal 10A3. Accordingly, the gate resistance is increased and the switching speed is slowed down.

In addition, in a case where the speed when the power semiconductor module 10A is turned off is made higher, both the first ON transistor 12A1a and the second ON transistor 12A1c are controlled such that they are turned off, and both the first OFF transistor 12A1b and the second OFF transistor 12A1d are controlled such that they are turned on. When both the first OFF transistor 12A1b and the second OFF transistor 12A1d are controlled such that they are turned on, then both the gate resistors 12A2b and 12A2d are connected to the first signal input terminal 10A3 in parallel so that gate resistance is decreased and the switching speed is made higher.

In a case, however, where the speed when the power semiconductor module 10A is turned off is slowed down, both the first ON transistor 12A1a and the second ON transistor 12A1c are controlled such that they are turned off, and only one of the first OFF transistor 12A1b and the second OFF transistor 12A1d is controlled such that it is turned on. For example, when only the first OFF transistor 12A1b is controlled such that it is turned on, then only the gate resistor 12A2b is connected to the first signal input terminal 10A3 so that the gate resistance is increased and the switching speed is slowed down.

Note that the above-described control is an example, and the present invention is not limited to these controls. For example, in a case where the gate resistor 12A2c having a resistance value smaller than a resistance value of the gate resistor 12A2a is used and the speed when the power semiconductor module 10A is turned on is slowed down, the first ON transistor 12A1a, which is connected to the gate resistor 12A2a having a relatively larger resistance value, can be controlled such that it is turned on. In a case where the speed when the power semiconductor module 10A is turned on is made higher, the second ON transistor 12A1c, which is connected to the gate resistor 12A2c having a relatively smaller resistance value, can be controlled such that it is turned on. For example, in a case where the gate resistor 12A2d having a resistance value smaller than a resistance value of the gate resistor 12A2b is used and the speed when the power semiconductor module 10A is turned off is slowed down, the first OFF transistor 12A1b, which is connected to the gate resistor 12A2b having a relatively larger resistance value, can be controlled such that it is turned on. In a case where the speed when the power semiconductor module 10A is turned off is made higher, the second OFF transistor 12A1d, which is connected to the gate resistor 12A2d having a relatively smaller resistance value, can be controlled such that it is turned on.

According to the power converter of the first embodiment, the voltage dividing circuit including the plurality of impedance elements is formed as a substrate, and the voltage dividing circuit board is mounted on the power semiconductor module. Therefore, it is possible to ensure mechanical strength to withstand vibrations.

According to the power converter of the first embodiment, the divided voltage output terminal is provided on the voltage dividing circuit board to take out the divided voltage, and the voltages generated in the optional impedance elements from among the impedance element group are input to the gate driving circuit via the divided voltage output terminal. Therefore, the constant of the impedance elements for generating the divided voltages can be easily changed.

Second Embodiment

Figure 6:
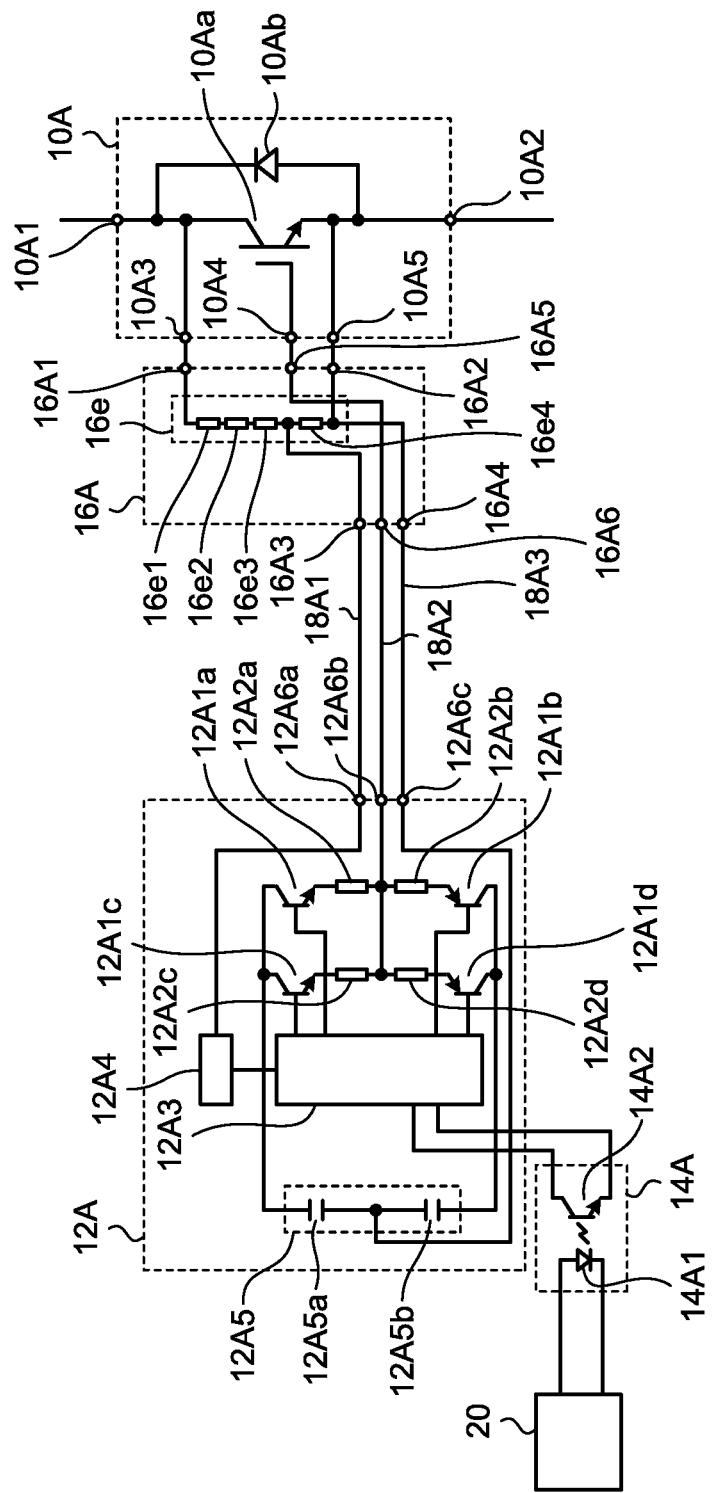
FIG. 6 is a circuit diagram illustrating a configuration of a main part of a power converter according to a second embodiment.
Figure 7:
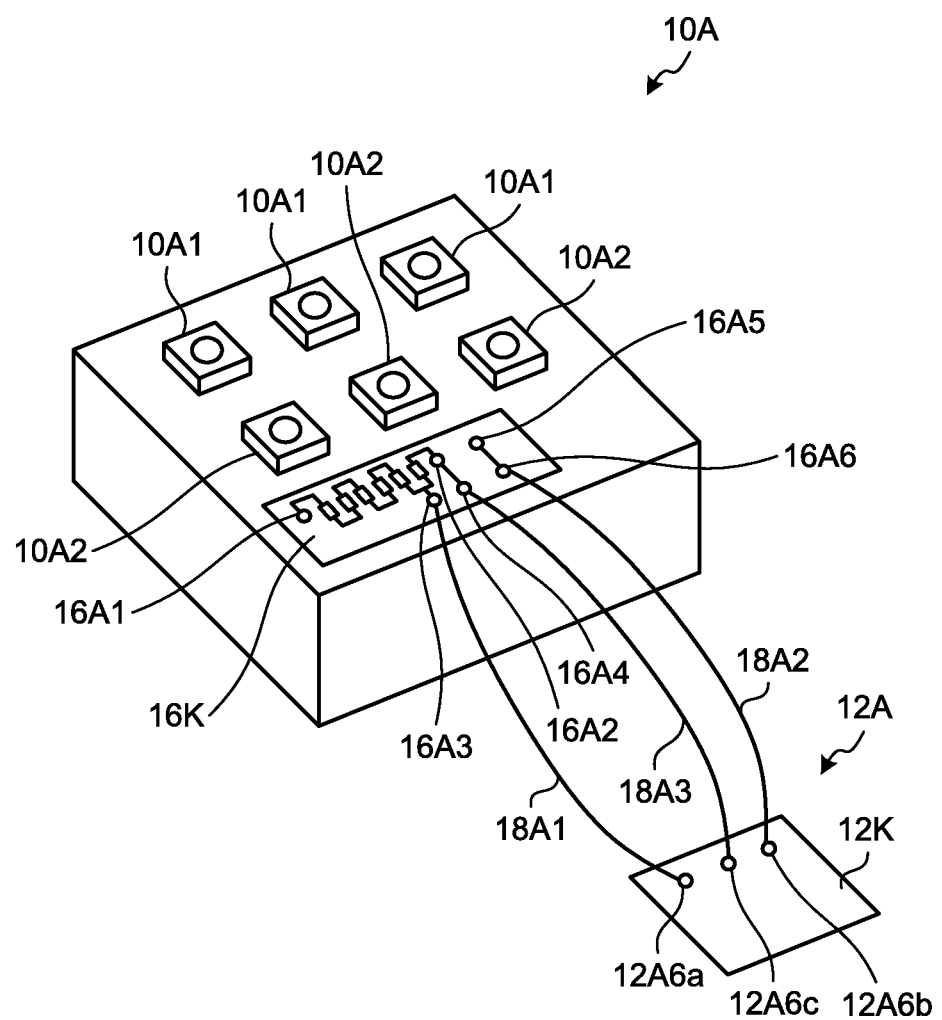
FIG. 7 is a perspective view illustrating a connection example between a voltage dividing circuit board and a gate driving circuit board in the power converter according to the second embodiment.

FIG. 6 is a circuit diagram illustrating a configuration of the main parts of a power converter according to a second embodiment. FIG. 7 is a perspective view illustrating a connection example between the voltage dividing circuit board 16K and the gate driving circuit board 12K in the power converter according to the second embodiment. In the power converter according to the second embodiment illustrated in FIGS. 6 and 7, the configuration of the power converter according to the first embodiment illustrated in FIG. 1 in which the gate output terminal 12A6b of the gate driving circuit 12A is coupled to the gate auxiliary terminal 10A4 of the power semiconductor module 10A with the signal line 18A2 is changed to a configuration in which the gate output terminal 12A6b is coupled to the gate auxiliary terminal 10A4 via the voltage dividing circuit 16A.

As illustrated in FIG. 7, a gate connection terminal 16A5 and a gate input terminal 16A6 are provided on the voltage dividing circuit board 16K. The gate connection terminal 16A5 and the gate input terminal 16A6 are connected to each other on the substrate. The gate input terminal 16A6 is coupled to the gate output terminal 12A6b by the signal line 18A2. Note that the other components are the same as or equivalent to those in FIG. 1. Therefore, the same or equivalent components are denoted with the same reference numerals and redundant description is omitted.

According to the power converter according to the second embodiment, in the voltage dividing circuit board mounted on the power semiconductor module, the number of connection parts with the gate driving circuit is two in the first embodiment, and the number is increased to three in the second embodiment. Therefore, an effect can be obtained whereby the mechanical strength can be stronger than that in the first embodiment.

Third Embodiment

Figure 8:
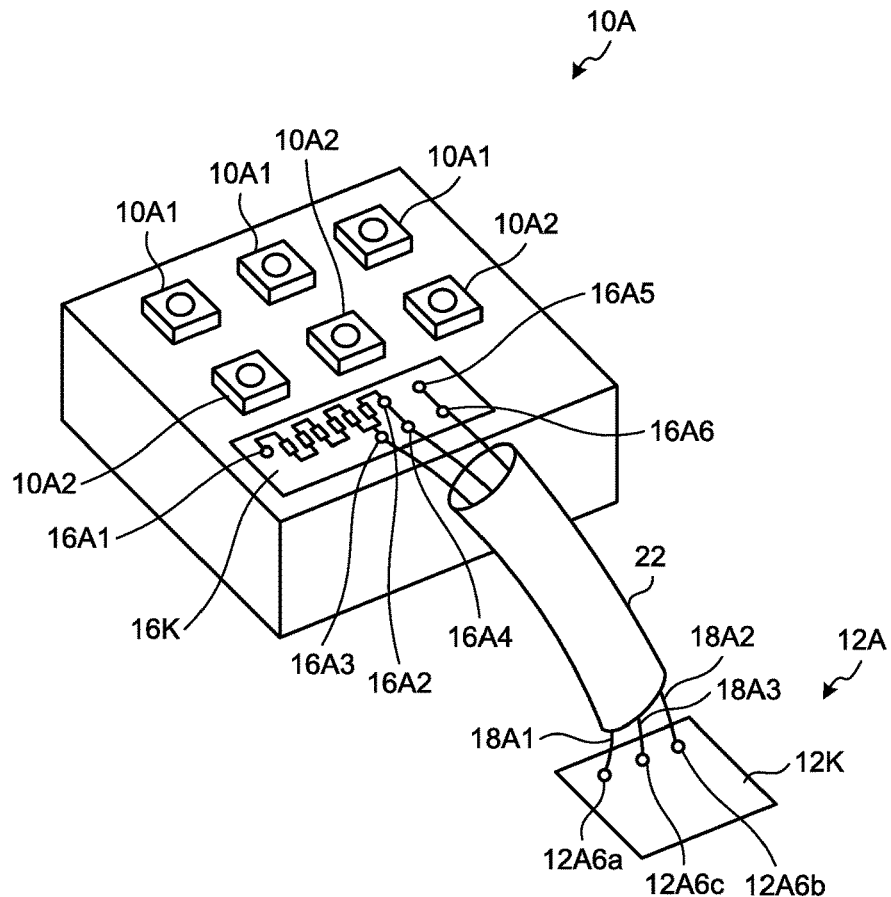
FIG. 8 is a perspective view illustrating a connection example between a voltage dividing circuit board and a gate driving circuit board in the power converter according to a third embodiment.

FIG. 8 is a perspective view illustrating a connection example between the voltage dividing circuit board 16K and the gate driving circuit board 12K in a power converter according to a third embodiment. In the power converter according to the third embodiment illustrated in FIG. 8, the signal lines 18A1, 18A2, and 18A3 for connecting the gate driving circuit board 12K and the voltage dividing circuit board 16K in the power converter according to the second embodiment illustrated in FIG. 7 are housed in an insulation tube 22. Note that the other components are the same as or equivalent to those in FIG. 7. Therefore, the same or equivalent components are denoted with the same reference numerals, and redundant description is omitted.

FIGS. 9 to 12 are cross-sectional views illustrating variations in which the signal lines are housed in the insulation tube (first to third examples).

Figure 9:
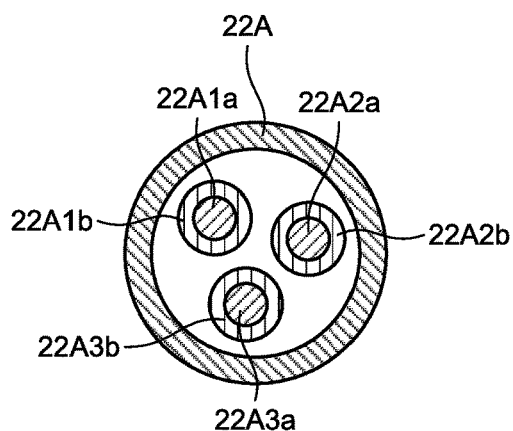
FIG. 9 is a cross-sectional view illustrating a first example in which signal lines are housed in an insulation tube used in the power converter according to the third embodiment.

First, FIG. 9 illustrates the first example. In the configuration illustrated in FIG. 9, three signal lines, i.e., a first signal line 22A1a, a second signal line 22A2a, and a third signal line 22A3a, are housed in an insulation tube 22A. The first signal line 22A1a, the second signal line 22A2a, and the third signal line 22A3a are respectively covered with a first signal line cover 22A1b, a second signal line cover 22A2b, and a third signal line cover 22A3b to ensure there is insulation even when the signal lines are in contact with each other. Although gaps can be seen between the signal lines in FIG. 9, it is possible to keep the signal lines in place by filling the gaps with a filling material or the like or by squeezing the insulation tube 22A.

According to the first example, because the first signal line 22A1a used as a divided voltage signal line and the third signal line 22A3a used as an emitter signal line can be arranged to be close to each other, a line loop around the first signal line 22A1a and the third signal line 22A3a can be shortened, and the parasitic inductance between the first signal line 22A1a and the third signal line 22A3a can be reduced. Therefore, the signal quality of the divided voltage transmitted from the voltage dividing circuit board 16K to the gate driving circuit 12A can be improved.

Figure 10:
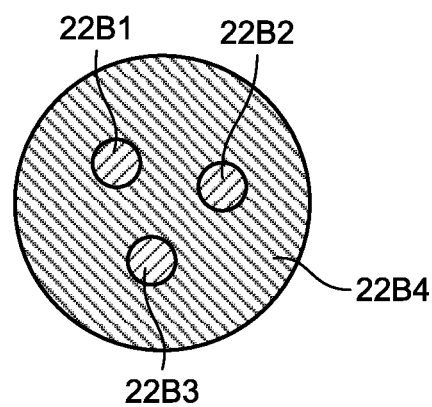
FIG. 10 is a cross-sectional view illustrating a second example in which signal lines are housed in an insulation tube used in the power converter according to the third embodiment.

FIG. 10 illustrates a second example. In the configuration of the example illustrated in FIG. 10, a first signal line 22B1, a second signal line 22B2, and a third signal line 22B3 housed in an insulation tube 22B are not separately covered, and the first signal line 22B1, the second signal line 22B2, and the third signal line 22B3 are collectively covered. That is, in the second example, a cover 22B4 covering the first signal line 22B1, the second signal line 22B2, and the third signal line 22B3 and a cylindrical portion forming the insulation tube 22B are integrated.

According to the second example, because the first signal line 22B1, the second signal line 22B2, and the third signal line 22B3 are rigidly held in the insulation tube 22B, in addition to the effect of the first example, the mechanical strength to withstand vibrations can be further strengthened.

Figure 11:
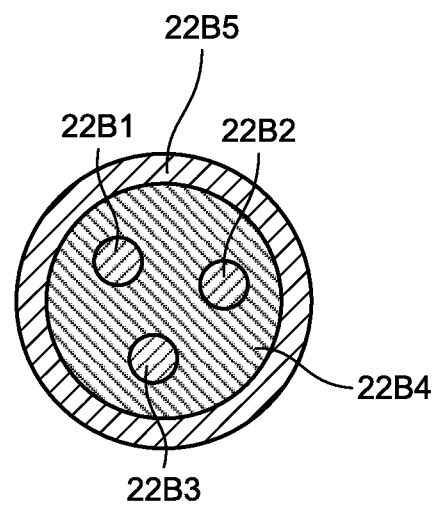
FIG. 11 is a cross-sectional view illustrating a modification of the second example illustrated in FIG. 10.

FIG. 11 is a diagram illustrating a modification of the second example. As illustrated in FIG. 11, the cover 22B4 covering the first signal line 22B1, the second signal line 22B2, and the third signal line 22B3 and a cylindrical portion 22B5 forming the insulation tube can be made of different members.

Figure 12:
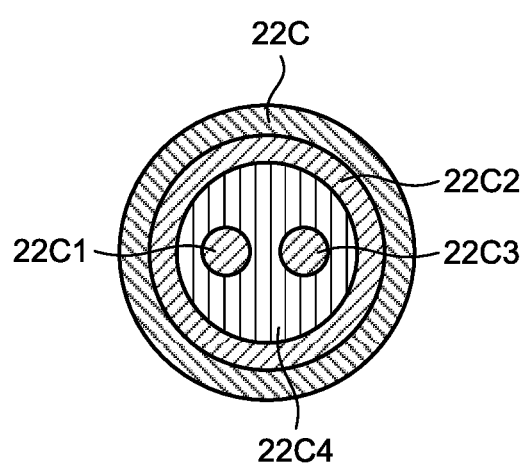
FIG. 12 is a cross-sectional view illustrating a third example in which signal lines are housed in an insulation tube used in the power converter according to the third embodiment.

FIG. 12 illustrates the third example. In the configuration illustrated in FIG. 12, regarding a first signal line 22C1, a second signal line 22C2, and a third signal line 22C3 housed in an insulation tube 22C, the second signal line 22C2 is formed in a cylindrical shape. The first signal line 22C1 and the third signal line 22C3 are housed in the second signal line 22C2, and a common cover 22C4 is applied to the first signal line 22C1 and the third signal line 22C3.

According to the third example, because the first signal line 22C1, the second signal line 22C2, and the third signal line 22C3 are rigidly held in the insulation tube 22C, in addition to the effect of the first example, the mechanical strength to withstand vibrations can be further strengthened.

Furthermore, when the power converter is controlled at high speed, because high-speed switching signals (gate driving signals) are applied to the gate signal lines, the gate signal lines are easily affected by the skin effect. In the third example, an additional effect can be obtained in which the cylindrical second signal line 22C2 used as the gate signal line is hardly affected by the skin effect.

Fourth Embodiment

In a fourth embodiment, a case where a two-in-one module is used as a power semiconductor module included in a power conversion circuit will be described.

Figure 13:
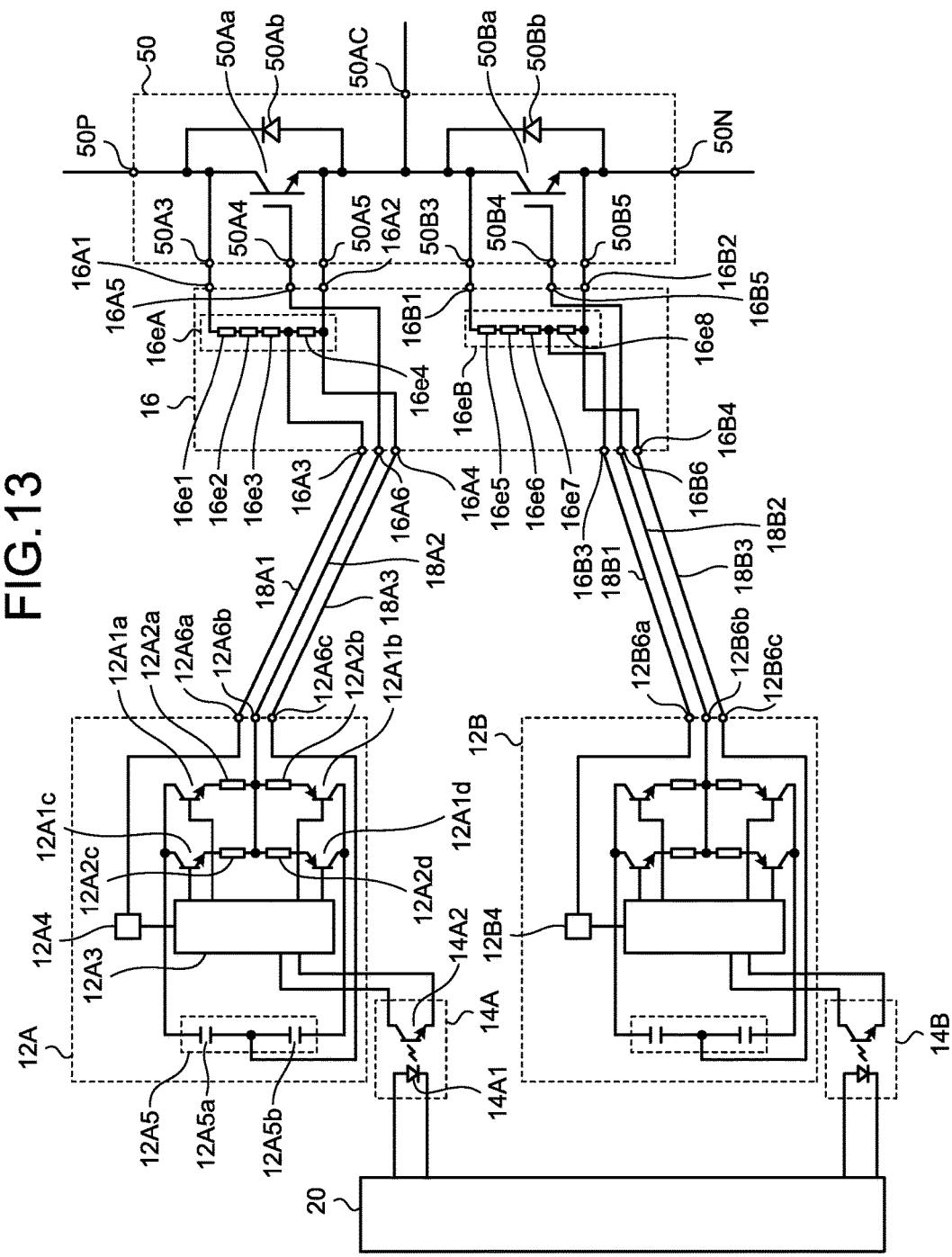
FIG. 13 is a circuit diagram illustrating a configuration of a main part of a power converter according to a fourth embodiment.
Figure 14:
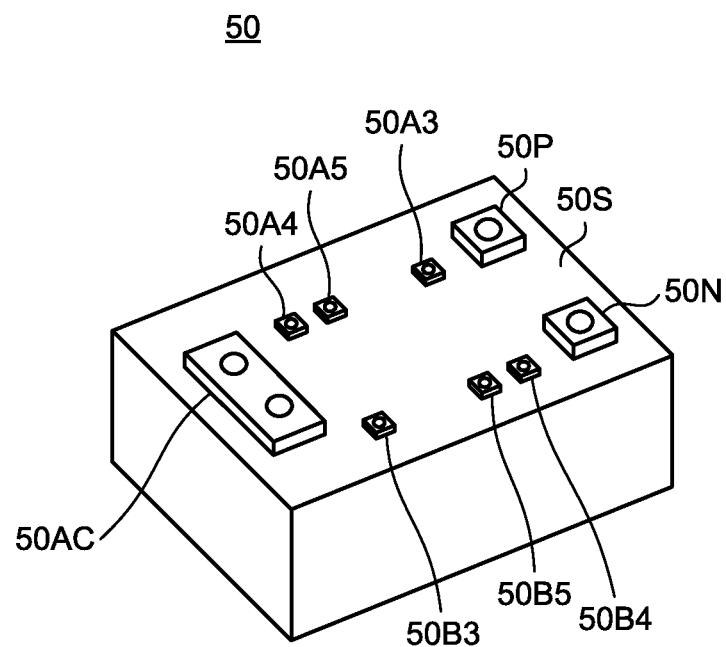
FIG. 14 is a perspective view illustrating an arrangement example of terminals of a power semiconductor module in the power converter according to the fourth embodiment.
Figure 15:
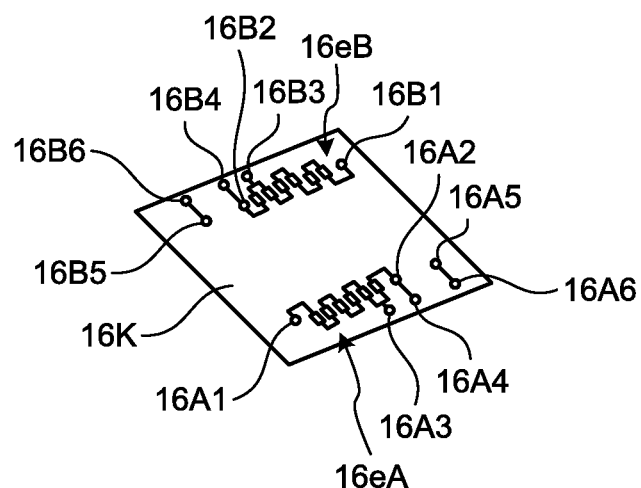
FIG. 15 is a perspective view illustrating an exemplary configuration of a voltage dividing circuit in the power converter according to the fourth embodiment.
Figure 16:
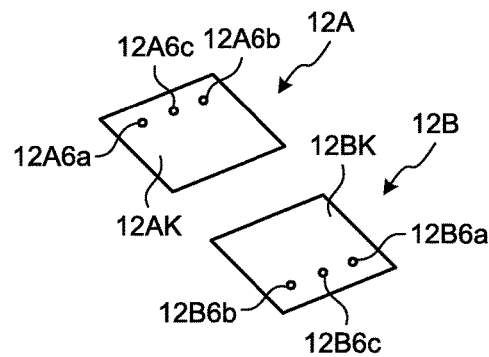
FIG. 16 is a perspective view illustrating an arrangement example of terminals of a gate driving circuit in the power converter according to the fourth embodiment.
Figure 17:
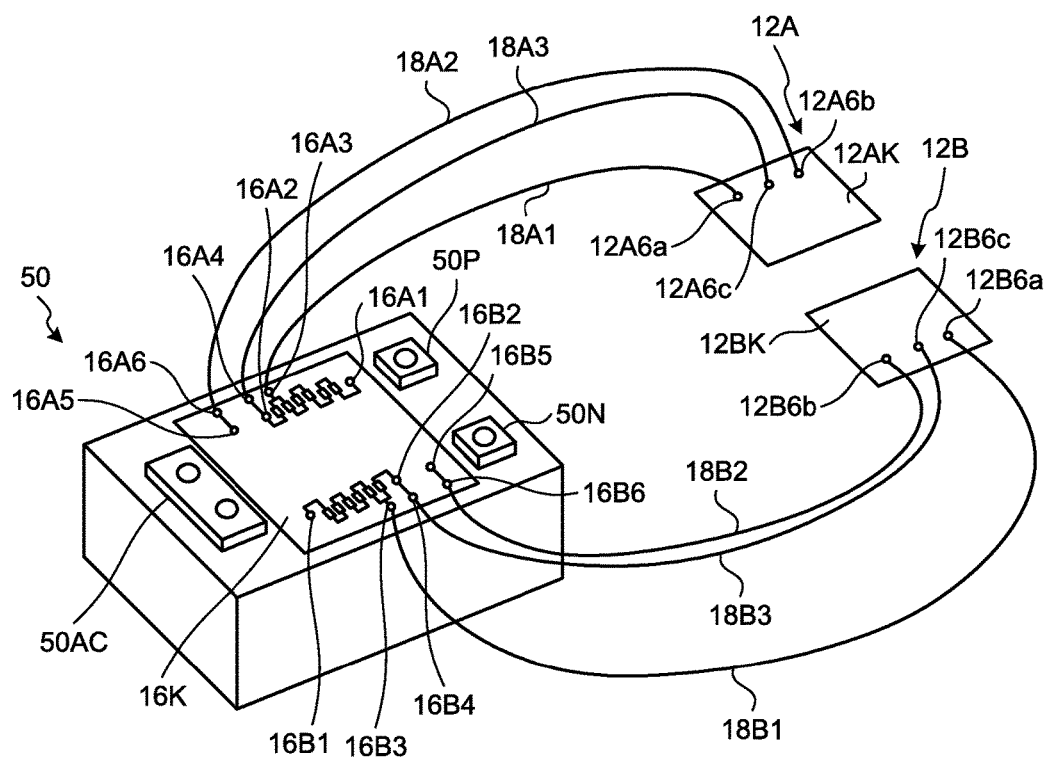
FIG. 17 is a perspective view illustrating a connection example between a voltage dividing circuit board and a gate driving circuit board in the power converter according to the fourth embodiment.

FIG. 13 is a circuit diagram illustrating a configuration of the main parts of a power converter according to the fourth embodiment. Each of FIGS. 14 to 17 is a perspective view illustrating the configuration of a main part in the power converter according to the fourth embodiment. FIG. 14 illustrates an arrangement example of terminals of a power semiconductor module 50, and FIG. 15 illustrates an exemplary configuration of a voltage dividing circuit 16. FIG. 16 illustrates an arrangement example of terminals of the gate driving circuits 12A and 12B, and FIG. 17 illustrates a connection example between gate driving circuit boards 12AK and 12BK and the voltage dividing circuit board 16K, as illustrated in FIGS. 14 to 16. The configurations illustrated in FIGS. 14 to 17 are only exemplary, and the present invention is not limited to the configuration examples illustrated in FIGS. 14 to 17.

In FIG. 13, the power semiconductor module 50 is a two-in-one module that has a first semiconductor switching element having a transistor element 50Aa and a diode element 50Ab connected in parallel and has a second semiconductor switching element having a transistor element 50Ba and a diode element 50Bb connected in parallel, with the first semiconductor switching element and the second semiconductor switching element being connected in series and housed in the module. The first semiconductor switching element forms a P-side arm, and the second semiconductor switching element forms an N-side arm. As the transistor elements 50Aa and 50Ba, an IGBT illustrated in FIG. 13 is exemplified. However, the transistor element is not limited to being an IGBT. Depending on the characteristics of the load, the connection of the diode elements 50Ab and 50Bb can be omitted, e.g., in the case of a resistance load.

The power semiconductor module 50 is provided with a P-side main terminal 50P, which is a high-potential-side main terminal; an N-side main terminal 50N which is a low-potential-side main terminal; an AC main terminal 50AC, which is an alternate current main terminal to connect to a load which is not illustrated; a P-side collector auxiliary terminal 50A3, which is a first signal input terminal; a P-side gate auxiliary terminal 50A4, which is a second signal input terminal; a P-side emitter auxiliary terminal 50A5, which is a third signal input terminal; an N-side collector auxiliary terminal 50B3, which is a fourth signal input terminal; an N-side gate auxiliary terminal 50B4, which is a fifth signal input terminal; and an N-side emitter auxiliary terminal 50B5, which is a sixth signal input terminal.

An arrangement example of the P-side main terminal 50P, the N-side main terminal 50N, the AC main terminal 50AC, the P-side collector auxiliary terminal 50A3, the P-side gate auxiliary terminal 50A4, the P-side emitter auxiliary terminal 50A5, the N-side collector auxiliary terminal 50B3, the N-side gate auxiliary terminal 50B4, and the N-side emitter auxiliary terminal 50B5 is as illustrated in FIG. 14. According to FIG. 14, the P-side main terminal 50P, the N-side main terminal 50N, the AC main terminal 50AC, the P-side collector auxiliary terminal 50A3, the P-side gate auxiliary terminal 50A4, the P-side emitter auxiliary terminal 50A5, the N-side collector auxiliary terminal 50B3, the N-side gate auxiliary terminal 50B4, and the N-side emitter auxiliary terminal 50B5 are arranged on one main surface of a module housing 50S.

The P-side main terminal 50P is arranged at a corner portion of the module housing 50S. The N-side main terminal 50N is arranged at an opposite corner portion to the P-side main terminal 50P in a direction perpendicular to the longitudinal direction of the module housing 50S.

The P-side collector auxiliary terminal 50A3, the P-side gate auxiliary terminal 50A4, and the P-side emitter auxiliary terminal 50A5 are arranged in the following order: the P-side collector auxiliary terminal 50A3, the P-side emitter auxiliary terminal 50A5, and then the P-side gate auxiliary terminal 50A4. Further, they are arranged at the center of the module housing 50S along the longitudinal direction of the module housing 50S from the side of the P-side main terminal 50P. The interval between the P-side gate auxiliary terminal 50A4 and the P-side emitter auxiliary terminal 50A5 is narrower than the interval between the P-side collector auxiliary terminal 50A3 and the P-side emitter auxiliary terminal 50A5.

The N-side collector auxiliary terminal 50B3, the N-side gate auxiliary terminal 50B4, and the N-side emitter auxiliary terminal 50B5 are arranged in the following order: the N-side gate auxiliary terminal 50B4, the N-side emitter auxiliary terminal 50B5, and then the N-side collector auxiliary terminal 50B3. Further, they are arranged at the center of the module housing 50S and along the longitudinal direction of the module housing 50S from the side of the N-side main terminal 50N. The interval between the N-side gate auxiliary terminal 50B4 and the N-side emitter auxiliary terminal 50B5 is narrower than the interval between the N-side collector auxiliary terminal 50B3 and the N-side emitter auxiliary terminal 50B5.

The AC main terminal 50AC has an elongated shape in a direction perpendicular to the longitudinal direction of the module housing 50S and is arranged on the opposite side of the side where the P-side main terminal 50P and the N-side main terminal 50N are arranged in a state where the longitudinal direction of the AC main terminal 50AC is perpendicular to the longitudinal direction of the module housing 50S.

The arrangement example in FIG. 14 is an example, and it is clearly understood that other arrangement examples can be used.

The description here returns to FIG. 13. The gate driving circuit 12A is a first gate driving circuit for driving the first semiconductor switching element (transistor element 50Aa) forming the P-side arm of the power semiconductor switching elements included in the power semiconductor module 50, and a gate driving circuit 12B is a second gate driving circuit for driving the second semiconductor switching element (transistor element 50Ba) forming the N-side arm of the power semiconductor switching elements included in the power semiconductor module 50.

The configuration of the gate driving circuit 12A is the same as or equivalent to the configuration of the second embodiment illustrated in FIG. 6. The same or equivalent components are denoted with the same reference numerals, and redundant description is omitted.

Furthermore, the configuration of the gate driving circuit 12B is similar to that of the gate driving circuit 12A and is similarly configured to the gate driving circuit 12A, with a divided voltage input terminal 12B6a, a gate output terminal 12B6b, and an emitter output terminal 12B6c being provided.

FIG. 16 illustrates an arrangement example of the terminals in the gate driving circuits 12A and 12B. In the gate driving circuit 12A, the divided voltage input terminal 12A6a, the gate output terminal 12A6b, and the emitter output terminal 12A6c are provided on the circuit board 12AK. In the gate driving circuit 12B, the divided voltage input terminal 12B6a, the gate output terminal 12B6b, and the emitter output terminal 12B6c are provided on the circuit board 12BK. The circuit configuration in FIG. 13 is realized in this way. Note that the circuit board 12AK and a circuit board on which the gate driving circuit 12A is mounted can form a single board as well as being different boards. The circuit board is referred to as a "gate driving circuit board" below.

The description returns to FIG. 13 here. The insulation circuit 14A electrically insulates the switching signal generation unit 20 from the gate driving circuit 12A, and an insulation circuit 14B electrically insulates the switching signal generation unit 20 from the gate driving circuit 12B. The configurations of the insulation circuits 14A and 14B are the same as or equivalent to that of the insulation circuit 14A illustrated in FIG. 6, and further description thereof will be omitted.

The voltage dividing circuit 16 is provided with an impedance element group 16eA to detect the voltage between main terminals in the P-side arm and an impedance element group 16eB to detect the voltage between main terminals in the N-side arm. The configuration and connection of the impedance element group 16eA are the same as or equivalent to those in FIG. 6, and the impedance element group 16eB will be described here.

In FIG. 13, as the impedance element group 16eB, four resistive elements 16e5, 16e6, 16e7, and 16e8 connected in series are exemplified.

The voltage dividing circuit 16 is provided with the collector connection terminal 16A1, the emitter connection terminal 16A2, the divided voltage output terminal 16A3, the emitter input terminal 16A4, the gate connection terminal 16A5, and the gate input terminal 16A6 illustrated in FIG. 6. In addition, a collector connection terminal 16B1, an emitter connection terminal 16B2, a divided voltage output terminal 16B3, an emitter input terminal 16B4, a gate connection terminal 16B5, and a gate input terminal 16B6, which connect the voltage dividing circuit 16 to the gate driving circuit 12B or the transistor element 50Ba forming the N-side arm, are provided. One end of the resistive element 16e5 is coupled to the collector connection terminal 16B1, and one end of the resistive element 16e8 is coupled to each of the emitter connection terminal 16B2 and the emitter input terminal 16B4. A connection point between the resistive elements 16e7 and 16e8 is coupled to the divided voltage output terminal 16B3. That is, in the configuration in FIG. 13, a divided voltage generated in the resistive element 16e8 is applied to the gate driving circuit 12B.

FIG. 15 illustrates one exemplary configuration of the voltage dividing circuit 16. In the voltage dividing circuit 16, the impedance element groups 16eA and 16eB are arranged on the voltage dividing circuit board 16K, and the resistive elements are coupled to each other by electric lines respectively formed in substantially U-shapes so that the terminals can be easily provided. More specifically, the collector connection terminal 16A1, the emitter connection terminal 16A2, the divided voltage output terminal 16A3, the emitter input terminal 16A4, the gate connection terminal 16A5, and the gate input terminal 16A6 are provided on the electric line which couples between the resistive elements in the impedance element group 16eA; and the collector connection terminal 16B1, the emitter connection terminal 16B2, the divided voltage output terminal 16B3, the emitter input terminal 16B4, the gate connection terminal 16B5, and the gate input terminal 16B6 are provided on the electric line which couples between the resistive elements in the impedance element group 16eB. The circuit configuration in FIG. 13 is realized in this way.

Furthermore, as illustrated in FIG. 17, the voltage dividing circuit 16 is mounted on the power semiconductor module 50. At this time, the collector connection terminal 16A1 and the P-side collector auxiliary terminal 50A3 of the power semiconductor module 50 are electrically connected to each other, and the emitter connection terminal 16A2 and the P-side emitter auxiliary terminal 50A5 of the power semiconductor module 50 are electrically connected to each other. The gate connection terminal 16A5 and the P-side gate auxiliary terminal 50A4 of the power semiconductor module 50 are electrically connected to each other, and the collector connection terminal 16B1 and the N-side collector auxiliary terminal 50B3 of the power semiconductor module 50 are electrically connected to each other. The emitter connection terminal 16B2 and the N-side emitter auxiliary terminal 50B5 of the power semiconductor module 50 are electrically connected to each other, and the gate connection terminal 16B5 and the N-side gate auxiliary terminal 50B4 of the power semiconductor module 50 are electrically connected to each other.

In addition, the divided voltage output terminal 16A3 of the voltage dividing circuit 16 and the divided voltage input terminal 12A6a of the gate driving circuit board 12AK are connected by the signal line 18A1, and the gate input terminal 16A6 of the voltage dividing circuit 16 and the gate output terminal 12A6b of the gate driving circuit board 12AK are connected by the signal line 18A2. The emitter input terminal 16A4 of the voltage dividing circuit 16 and the emitter output terminal 12A6c of the gate driving circuit board 12AK are connected by the signal line 18A3, and the divided voltage output terminal 16B3 of the voltage dividing circuit 16 and the divided voltage output terminal 12B6a of the gate driving circuit board 12BK are connected by a signal line 18B1. The gate input terminal 16B6 of the voltage dividing circuit 16 and the gate output terminal 12B6b of the gate driving circuit board 12BK are connected by a signal line 18B2, and the emitter input terminal 16B4 of the voltage dividing circuit 16 and the emitter output terminal 12B6c of the gate driving circuit board 12BK are connected by a signal line 18B3. With these configurations, the circuit configuration illustrated in FIG. 13 is realized.

Note that the impedance element group 16e can be formed by connecting capacitors or diodes in series instead of the resistive elements. The configuration is not limited to series connection of the resistive elements, the capacitors, or the diodes, and parallel circuits of the resistive elements, the capacitors, or the diodes connected in series can be used. In addition, a combination of at least two of the resistive element, the capacitor, and the diode can be used.

In addition, although an example in which the divided voltages generated in the resistive elements 16e4 and 16e8 are detected has been illustrated in FIG. 13, larger divided voltages can be used depending on the withstandable input voltages of the divided voltage determination units 12A4 and 12B4. For example, a voltage across the resistive elements 16e3 and 16e4 and a voltage across the resistive elements 16e7 and 16e8 can be taken out as divided voltages.

The operations of the gate driving circuits 12A and 12B to switch the switching speed in accordance with the divided voltage generated by the voltage dividing circuit 16 are similar to those in the first embodiment, and the detailed description thereof will be omitted.

As described above, even when the power semiconductor module is a two-in-one module, the present invention can be applied.

The third embodiment discloses a configuration in which the gate connection terminals 16A5 and 16B5 and the gate input terminals 16A6 and 16B6 are provided on the voltage dividing circuit board 16K. However, similarly to the first embodiment illustrated in FIG. 1, a configuration can be applied in which the gate connection terminals 16A5 and 16B5 and the gate input terminals 16A6 and 16B6 are not provided. In this case, it is preferable that the gate output terminal 12A6b of the gate driving circuit 12A and the P-side gate auxiliary terminal 50A4 of the power semiconductor module 50 be connected to each other by the signal line 18A2 and the gate output terminal 12B6b of the gate driving circuit 12B and the N-side gate auxiliary terminal 50B4 of the power semiconductor module 50 be connected to each other by the signal line 18B2. However, in this configuration, the voltage dividing circuit board 16K and the gate driving circuits 12A and 12B are connected at four points. Therefore, the configurations in FIGS. 13 and 17 having six connection points with the gate driving circuits 12A and 12B have higher mechanical strength.

In addition, a case where the power semiconductor module is a one-in-one module and a two-in-one module has been described in the first to fourth embodiments. However, the present invention is not limited to the embodiments. For example, even when the power semiconductor module is a four-in-one module, a six-in-one module, and the like, the present invention can be applied.

Fifth Embodiment

Figure 18:
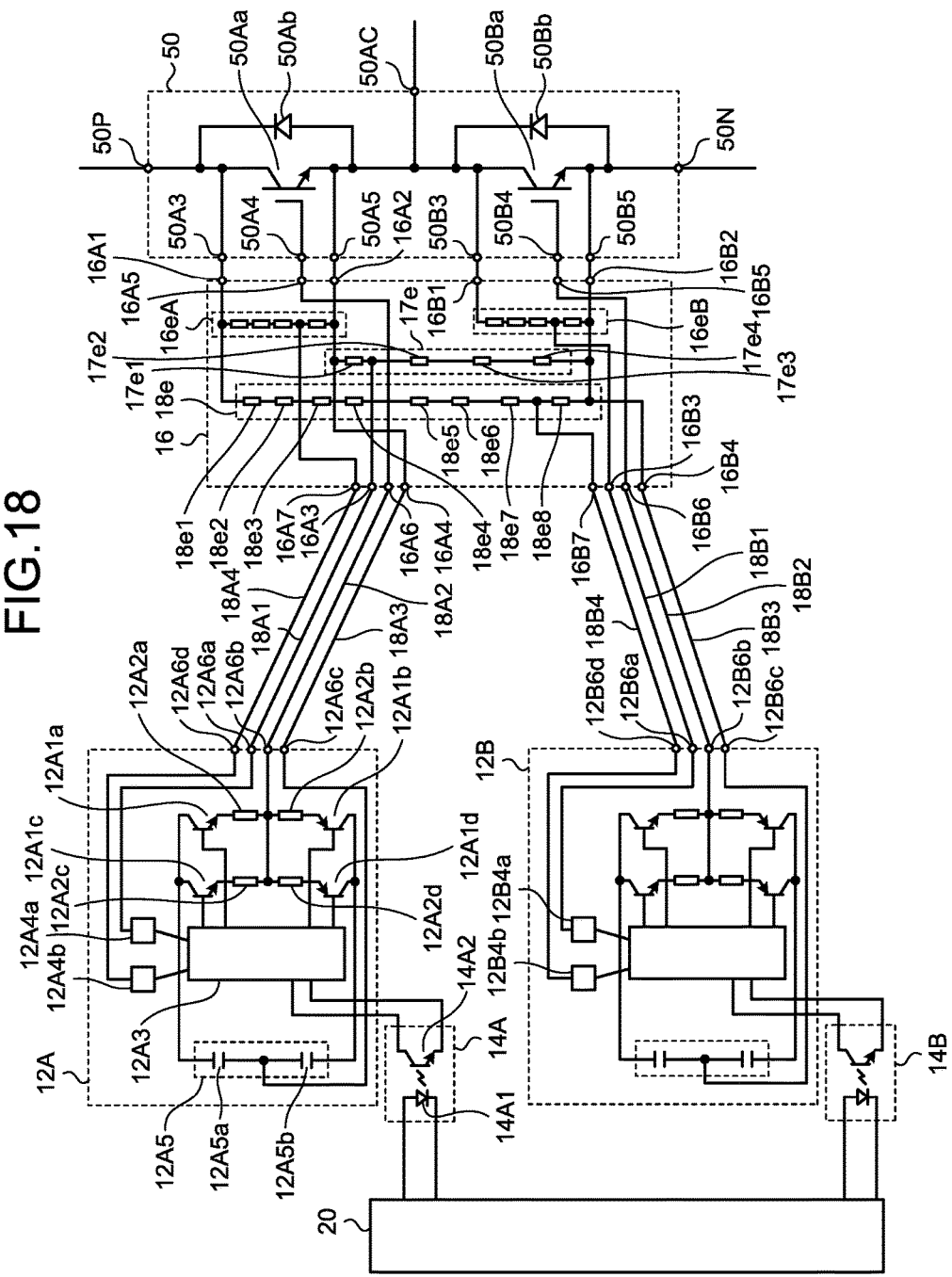
FIG. 18 is a circuit diagram illustrating a configuration of a main part of a power converter according to a fifth embodiment.
Figure 19:
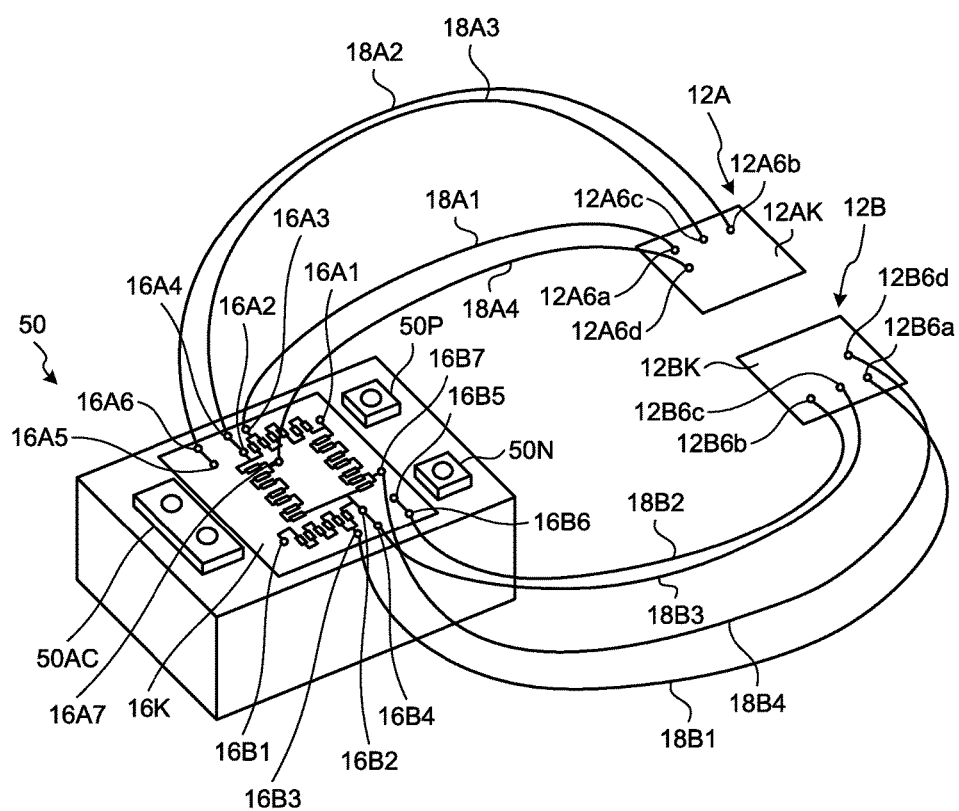
FIG. 19 is a perspective view illustrating a connection example between a voltage dividing circuit board and a gate driving circuit board in the power converter according to the fifth embodiment.

FIG. 18 is a circuit diagram illustrating a configuration of the main parts of a power converter according to a fifth embodiment. FIG. 19 is a perspective view illustrating a connection example between the voltage dividing circuit board 16K and the gate driving circuit boards 12AK and 12BK in the power converter according to the fifth embodiment. In the power converter according to the fifth embodiment illustrated in FIGS. 18 and 19, in comparison with the power converter according to the fourth embodiment illustrated in FIGS. 13 and 17, the number of impedance elements mounted on the voltage dividing circuit board 16K is increased, and information on divided voltages transmitted to the gate driving circuits 12A and 12B is increased. Because the information on the divided voltages is increased, as illustrated in FIG. 17, divided voltage determination units 12A4a and 12A4b are provided in the gate driving circuit 12A and divided voltage determination units 12B4a and 12B4b are provided in the gate driving circuit 12B. In addition, a divided voltage input terminal 12A6d is further provided on the gate driving circuit board 12AK, and a divided voltage input terminal 12B6d is further provided on the gate driving circuit board 12BK. A divided voltage output terminal 16A7 and the divided voltage input terminal 12A6d are connected to each other by a signal line 18A4, which is a divided voltage signal line, and a divided voltage output terminal 16B7 and the divided voltage input terminal 12B6d are connected to each other by a signal line 18B4, which is a divided voltage signal line.

In the voltage dividing circuit 16 according to the fifth embodiment illustrated in FIG. 18, the configuration in FIG. 13 having the impedance element groups 16eA and 16eB, is provided with an impedance element group 17e having four resistive elements 17e1, 17e2, 17e3, and 17e4 connected in series and with an impedance element group 18e having eight resistive elements 18e1, 18e2, 18e3, 18e4, 18e5, 18e6, 18e7, and 18e8 connected in series. The voltage dividing circuit 16 further includes the divided voltage output terminals 16A7 and 16B7 in addition to the divided voltage output terminals 16A3 and 16B3.

In the impedance element group 17e, one end of the resistive element 17e1 is coupled to each of the emitter connection terminal 16A2 and the emitter input terminal 16A4, one end of the resistive element 17e4 is coupled to each of the emitter connection terminal 16B2 and the emitter input terminal 16B4, and a connection point between the resistive elements 17e1 and 17e2 is coupled to the divided voltage output terminal 16A3. That is, in the configuration in FIG. 18, the divided voltage generated in the resistive element 17e1 is applied to the divided voltage determination unit 12A4a.

In the impedance element group 18e, one end of the resistive element 18e1 is coupled to the collector connection terminal 16A1, one end of the resistive element 18e8 is coupled to each of the emitter connection terminal 16B2 and the emitter input terminal 16B4, and a connection point between the resistive elements 18e7 and 18e8 is coupled to the divided voltage output terminal 16B7. That is, in the configuration in FIG. 18, the divided voltage generated in the resistive element 17e8 is applied to the divided voltage determination unit 12B4b.

In addition, in the configuration in FIG. 18, the divided voltage generated in the resistive element 16e4 of the impedance element group 16eA is applied to the divided voltage determination unit 12A4b, and the divided voltage generated in the resistive element 16e8 of the impedance element group 16eB is applied to the divided voltage determination unit 12B4a.

According to the power converter according to the fifth embodiment, the information on the divided voltage transmitted to the gate driving circuit is increased. Therefore, for example, in a case where a load performs a source operation or a sink operation, the voltage between the main terminals at the time of each of various operations in which a semiconductor switching element is turned on from an off-state or is turned off from an on-state can be detected. Therefore, it is possible to enlarge the range of control for changing the switching speed.

According to the power converter according to the fifth embodiment, in the voltage dividing circuit board mounted on the power semiconductor module, the number of parts connected to the gate driving circuit, which is six in the fourth embodiment, is increased to eight in the fifth embodiment. Therefore, an effect can be obtained whereby the mechanical strength can be stronger than that in the fourth embodiment.

In the configuration of the fifth embodiment, it is preferable that the signal lines 18A1 to 18A4 and the signal lines 18B1 to 18B4 for connecting the gate driving circuit boards 12AK and 12BK and the voltage dividing circuit board 16K be housed in an insulation tube similarly to the third embodiment. With this configuration, because the signal lines 18A1 to 18A4 and the signal lines 18B1 to 18B4 are rigidly held in the insulation tube, the mechanical strength to withstand vibrations can be further strengthened. In addition, because a line loop around the signal lines 18A1 to 18A4 and a line loop around the signal lines 18B1 to 18B4 can be made shorter, the parasitic inductance between the signal lines can be reduced and signal quality of the divided voltage transmitted from the voltage dividing circuit board 16K to each of the gate driving circuits 12A and 12B can be improved.

The structures described in the above embodiments indicate exemplary contents of the present invention and can be combined with other known techniques. Furthermore, the structures indicated in the embodiment can be partially omitted and changed without departing from the scope of the present invention.

REFERENCE SIGNS LIST 10A, 50 power semiconductor module; 10Aa, 50Aa, 50Ba transistor element; 10Ab, 50Ab, 50Bb diode element; 10S module housing; 10A1 collector main terminal (first main terminal); 10A2 emitter main terminal (second main terminal); 10A3 collector auxiliary terminal (first signal input terminal); 10A4 gate auxiliary terminal (second signal input terminal); 10A5 emitter auxiliary terminal (third signal input terminal); 12A gate driving circuit (first gate driving circuit); 12B gate driving circuit (second gate driving circuit); 12A1a first ON transistor; 12A1b first OFF transistor; 12A1c second ON transistor; 12A1d second OFF transistor; 12A2a, 12A2b, 12A2c, 12A2d gate resistor; 12A3 switching speed change unit; 12A4, 12B4, 12A4a, 12A4b, 12B4a, 12B4b divided voltage determination unit; 12A5 operation power supply; 12A5a, 12A5b capacitor; 12A6a, 12A6d, 12B6a, 12B6d divided voltage input terminal; 12A6b gate output terminal; 12A6c emitter output terminal; 12K, 12AK, 12BK circuit board (gate driving circuit board); 14A, 14B insulation circuit; 14A1 light emitting diode; 14A2 phototransistor; 16, 16A voltage dividing circuit; 16K voltage dividing circuit board; 16A1, 16B1 collector connection terminal; 16A2, 16B2 emitter connection terminal; 16A3, 16B3, 16A7, 16B7 divided voltage output terminal; 16A4, 16B4 emitter input terminal; 16A5, 16B5 gate connection terminal; 16A6, 16B6 gate input terminal; 16e, 16eA, 16eB, 17e, 18e impedance element group; 16e1 to 16e8, 17e1 to 17e4, 18e1 to 18e8 resistive element; 18A1 signal line (divided voltage signal line); 18A2 signal line (gate signal line); 18A3 signal line (emitter signal line); 18A4 signal line (divided voltage signal line); 18B4 signal line (divided voltage signal line); 20 switching signal generation unit; 22, 22A, 22B, 22C insulation tube; 22A1a, 22B1, 22C1 first signal line; 22A2a, 22B2, 22C2 second signal line; 22A3a, 22B3, 22C3 third signal line; 22A1b first signal line cover; 22A2b second signal line cover; 22A3b third signal line cover; 22B4, 22C4 cover; 22B5 cylindrical portion; 50A3 P-side collector auxiliary terminal (first signal input terminal); 50A4 P-side gate auxiliary terminal (second signal input terminal); 50A5 P-side emitter auxiliary terminal (third signal input terminal); 50B3 N-side collector auxiliary terminal (fourth signal input terminal); 50B4 N-side gate auxiliary terminal (fifth signal input terminal); 50B5 N-side emitter auxiliary terminal (sixth signal input terminal); 50AC AC main terminal; 50P P-side main terminal; 50N N-side main terminal; 50S module housing.

The invention claimed is:

1. A power converter comprising:
   a module to house therein one or a plurality of switching elements; and
   a gate driving circuit to drive the switching element,
   wherein the module includes:
      a first signal input terminal connected to a collector potential or a drain potential of the switching element; and
      a third signal input terminal connected to an emitter potential or a source potential of the switching element,
   the power converter includes a voltage dividing circuit to generate a divided voltage obtained by detecting a voltage between the first signal input terminal and the third signal input terminal and to transmit the voltage to the gate driving circuit,
   the voltage dividing circuit includes:
      a voltage dividing circuit board;
      an impedance element group disposed on the voltage dividing circuit board;
      a first connection terminal connected to one end of the impedance element group; and
      a second connection terminal connected to the other end of the impedance element group,
   the voltage dividing circuit board is mounted on the module such that the first connection terminal is connected to the first signal input terminal and the second connection terminal is connected to the third signal input terminal, and
   the gate driving circuit is mounted on a gate driving circuit board different from the voltage dividing circuit board, is connected to the voltage dividing circuit via a line for transmitting a divided voltage between the first signal input terminal and the third signal input terminal from the voltage dividing circuit to the gate driving circuit, and changes a driving speed of the switching element in accordance with the divided voltage that is output from the voltage dividing circuit.

2. The power converter according to claim 1, wherein the module includes a second signal input terminal connected to a gate potential of the switching element,
   the voltage dividing circuit includes a third connection terminal connected to a gate resistance disposed in the gate driving circuit, and
   the voltage dividing circuit is mounted on the module such that the third connection terminal is connected to the second signal input terminal.

3. The power converter according to claim 1, wherein a line for transmitting the divided voltage between the first signal input terminal and the third signal input terminal from the voltage dividing circuit to the gate driving circuit and a line by which the switching element is driven by the gate driving circuit are housed in a same insulation tube.

4. A power converter comprising:
a module to house a plurality of switching elements therein; and
a gate driving circuit to drive the switching elements, wherein
the module includes:
    an upper-side switching element to which a high-potential-side voltage is applied and a lower-side switching element to which a low-potential-side voltage is applied;
    a first signal input terminal connected to a collector potential or a drain potential of the upper-side switching element;
    a third signal input terminal and a fourth signal input terminal connected both to an emitter potential or a source potential of the upper-side switching element and to a collector potential or a drain potential of the lower-side switching element; and
    a sixth signal input terminal connected to an emitter potential or a source potential of the lower-side switching element,
the gate driving circuit includes:
    a first gate driving circuit to drive the upper-side switching element; and
    a second gate driving circuit to drive the lower-side switching element,
the power converter includes a voltage dividing circuit
    to generate a divided voltage obtained by detecting a voltage between the first signal input terminal and the third signal input terminal and to transmit the divided voltage to the first gate driving circuit, and
    to generate a divided voltage obtained by detecting a voltage between the fourth signal input terminal and the sixth signal input terminal and to transmit the divided voltage to the second gate driving circuit,
the voltage dividing circuit includes:
    a voltage dividing circuit board;
    a first impedance element group disposed on the voltage dividing circuit board;
    a first connection terminal connected to one end of the first impedance element group; and
    a second connection terminal connected to the other end of the first impedance element group;
    a second impedance element group disposed on the voltage dividing circuit board;
    a third connection terminal connected to one end of the second impedance element group; and
    a fourth connection terminal connected to the other end of the second impedance element group,
the voltage dividing circuit board is mounted on the module such that the first connection terminal is connected to the first signal input terminal, the second connection terminal is connected to the third signal input terminal, the third connection terminal is connected to the fourth signal input terminal, and the fourth connection terminal is connected to the sixth signal input terminal,
the first gate driving circuit
    is mounted on a first gate driving circuit board different from the voltage dividing circuit board,
    is connected to the voltage dividing circuit via a line for transmitting a divided voltage between the first signal input terminal and the third signal input terminal from the voltage dividing circuit to the first gate driving circuit, and
    changes a driving speed of the upper-side switching element in accordance with the divided voltage output from the voltage dividing circuit, and
the second gate driving circuit
    is mounted on a second gate driving circuit board different from the voltage dividing circuit board,
    is connected to the voltage dividing circuit via a line for transmitting a divided voltage between the fourth signal input terminal and the sixth signal input terminal from the voltage dividing circuit to the second gate driving circuit, and
    changes a driving speed of the lower-side switching element in accordance with the divided voltage output from the voltage dividing circuit board.

5. The power converter according to claim 4, wherein
the module includes:
    a second signal input terminal connected to a gate potential of the upper-side switching element; and
    a fifth signal input terminal connected to a gate potential of the lower-side switching element,
the voltage dividing circuit includes:
    a fifth connection terminal connected to a gate resistance disposed in the first gate driving circuit; and
    a sixth connection terminal connected to a gate resistance disposed in the second gate driving circuit, and
the voltage dividing circuit board is mounted on the module such that the fifth connection terminal is connected to the second signal input terminal and the sixth connection terminal is connected to the fifth signal input terminal.

6. The power converter according to claim 4, wherein
a line for transmitting the divided voltage between the first signal input terminal and the third signal input terminal from the voltage dividing circuit to the first gate driving circuit and a line by which the upper-side switching element is driven by the first gate circuit are housed in a same insulation tube, and
a line for transmitting the divided voltage between the fourth signal input terminal and the sixth signal input terminal from the voltage dividing circuit to the second gate driving circuit and a line by which the lower-side switching element is driven by the second gate circuit are housed in a same insulation tube.

* * * * *